(12) United States Patent
Chuang et al.

(10) Patent No.: US 7,335,940 B2
(45) Date of Patent: Feb. 26, 2008

(54) FLASH MEMORY AND MANUFACTURING METHOD THEREOF

(75) Inventors: I-Chun Chuang, Taipei (TW); Cheng-Yuan Hsu, Hsinchu (TW); Jui-Yu Pan, Pingtung County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 64 days.

(21) Appl. No.: 11/307,010

(22) Filed: Jan. 19, 2006

(65) Prior Publication Data
US 2006/0275985 A1 Dec. 7, 2006

(30) Foreign Application Priority Data
Jun. 7, 2005 (TW) .............................. 94118692 A (51) Int. Cl.
*H01L 29/788* (2006.01)
(52) U.S. Cl. .................. 257/315; 257/320; 257/321; 257/296; 257/E21.209; 257/E21.267; 257/E21.645
(58) Field of Classification Search ................ 257/315, 257/310, 314, 316, 318, 319, 320, 321, 411, 257/296, 639, 760
See application file for complete search history.

(56) References Cited

U.S. PATENT DOCUMENTS

| 6,714,454 | B2 * | 3/2004 | Ma et al. ................ 365/185.18 |
| 6,798,012 | B1 * | 9/2004 | Ma et al. ..................... 257/315 |
| 6,943,119 | B2 * | 9/2005 | Ko .............................. 438/694 |
| 7,069,652 | B2 * | 7/2006 | Heinemann et al. ........... 29/852 |
| 7,202,524 | B2 * | 4/2007 | Kim et al. ................... 257/330 |

* cited by examiner

*Primary Examiner*—David Nhu
(74) *Attorney, Agent, or Firm*—Jianq Chyun IP Office (57) ABSTRACT

A method for manufacturing flash memory is provided. A tunneling dielectric layer, a conductive layer and a patterned mask layer that exposes a portion of the conductive layer are formed on a substrate. An oxide layer is formed on the exposed conductive layer so that the conductive layer is partitioned through the oxide layer into blocks. The oxide layer is removed and an inter-gate dielectric layer is formed in the opening. A control gate that completely fills the opening is formed. A cap layer is formed over the control gate. The mask layer is then removed. Using the cap layer as a mask, a portion of the conductive layer is removed to form two floating gates under the control gate. An insulating layer is formed on the substrate. Source/drain regions are formed in the substrate on the respective sides of the control gate.

12 Claims, 11 Drawing Sheets

FLASH MEMORY AND MANUFACTURING METHOD THEREOF

CROSS-REFERENCE TO RELATED APPLICATION

This application claims the priority benefit of Taiwan application serial no. 94118692, filed on Jun. 7, 2005. All disclosure of the Taiwan application is incorporated herein by reference.

BACKGROUND OF THE INVENTION

1. Field of the Invention

The present invention relates to a semiconductor device. More particularly, the present invention relates to a flash memory and manufacturing method thereof.

2. Description of the Related Art

Memory is a type of semiconductor device for holding information and storing digital data. As the microprocessor of a computer becomes more powerful, the size of software programs and the amount of computation that can be carried out increase exponentially. As a result, the demand for memory with very high storage capacity increases at an alarming rate. To fabricate memories with a large storage at a low production cost, techniques and processes that can increase the level of integration has been eager sought and has become the principle driving force behind the constant improvement in semiconductor devices.

For example, in an flash memory, data can be stored, read out or erased from the flash memory numerous times and any stored data is retained even after power is cut off. With these advantages, flash memories have become one of the principle non-volatile memories commonly used in personal computers and electronic equipment.

Typically, a flash memory device is designed with a stacked gate structure including a polysilicon floating gate and a polysilicon control gate. The floating gate is disposed between the control gate and the substrate and is disposed in a floating state without any connection with other circuits. The control gate is generally connected to a word line. In addition, the flash memory may include a tunneling oxide layer and an inter-gate dielectric layer disposed between the substrate and the floating gate and between the floating gate and the control gate respectively.

In general, the floating gate and the control gate of the stack gate flash memory are defined by performing photolithographic and etching processes. However, defining the floating gate and the control gate through the photolithographic and etching processes not only increases processing difficulties, but also leads to the so-called critical dimension limitation of the photolithographic process. Consequently, it is very difficult to reduce the line width of devices, thereby creating an immense barrier for increasing the level of integration of the devices.

On the other hand, with the trend toward for increasing the level of integration forces the miniaturization of devices according to design rules. In the operation of flash memory, the operating voltage can be lower if the gate-coupling ratio (GCR) between the floating gate and the control gate is larger. One of the methods for increasing the gate-coupling ratio (GCR) includes increasing the capacitance of the inter-gate dielectric layer or reducing the capacitance of the tunneling oxide layer. The principle method for increasing the capacitance of the inter-gate dielectric layer includes increasing the overlapping area between the control gate layer and the floating gate. Thus, the common goal for the manufacturers of memory devices is to find an optimal process capable of reducing device dimension and yet somehow able to increase the overlapping area between the control gate layer and the floating gate so that a high-quality and highly integrated memory package is produced.

SUMMARY OF THE INVENTION

Accordingly, at least one objective of the present invention is to provide a flash memory and method of manufacturing the same that utilizes a self-aligned process to form a floating gate and a select gate. Hence, the processing steps are simplified and the production cost is reduced.

At least a second objective of the present invention is to provide a flash memory and manufacturing method thereof that can increase the gate-coupling ratio between the floating gate and the control gate, improve the performance of the device, and increase the product yield.

To achieve these and other advantages and in accordance with the purpose of the invention, as embodied and broadly described herein, the invention provides a method of manufacturing flash memory. First, a substrate having a doped region therein is provided. Then, a first dielectric layer, a first conductive layer and a mask layer are sequentially formed on the substrate. The first conductive layer includes at least doped polysilicon. The mask layer is patterned to form an opening that exposes a portion of the first conductive layer. Thereafter, a thermal oxidation process is performed to form an oxide layer over the exposed first conductive layer. After removing the oxide layer to expose the substrate, the first conductive layer is patterned so that the first conductive layer is dissected into blocks. A second dielectric layer is formed inside the opening. After that, a second conductive layer is formed over the substrate to fill the entire opening. The mask layer and a portion of the first conductive layer underneath the mask layer are removed to expose a portion of the substrate and form two third conductive layers under the second conductive layer. Then, an insulating layer is formed over the substrate and source/drain regions are formed in the substrate on the respective sides of the second conductive layer.

The aforementioned method of forming the flash memory includes forming a doped region in the substrate. Furthermore, the step of forming the doped region in the substrate is carried out after removing the oxide layer.

In the aforementioned method of forming the flash memory, the step of removing the mask layer and a portion of the first conductive layer underneath the mask layer to expose a portion of the substrate and form two third conductive layers under the second conductive layer is carried out forming a cap layer over the second conductive layer first. After that, the mask layer is removed to expose a portion of the first conductive layer. Thereafter, using the cap layer as a mask, a portion of the first conductive layer is removed to form two third conductive layers under the second conductive layer.

In the aforementioned method of forming the flash memory, the step of forming the cap layer over the second conductive layer includes performing a thermal oxidation process. The second conductive layer includes a control gate and the material constituting the second conductive layer includes doped polysilicon. The two third conductive layers include floating gates.

In the aforementioned method of forming the flash memory, the process for removing the oxide layer includes performing an etching operation by using hydrofluoric acid as an etching agent. The mask layer is fabricated from silicon nitride. The second dielectric layer includes an oxide/nitride/oxide composite stacked layer. The first dielectric layer includes a silicon oxide layer. The junction between the oxide layer and the first conductive layer is an arc surface.

In the present invention, the floating gates of the flash memory are formed in a self-aligned process. Therefore, the process window is increased and considerable production cost and time is saved.

Furthermore, the control gates are formed by directly filling an opening in the substrate with a conductive layer and then performing a chemical-mechanical polishing operation or a back etching operation to remove portion of the conductive layer outside the opening until the mask layer is exposed. In the process of forming the control gates, photolithographic techniques are not deployed. Again, the process window in increased and considerable production cost and time are saved.

The present invention also provides an alternative method for forming flash memory. First, a substrate is provided. Then, a first dielectric layer, a first conductive layer and a first mask layer are sequentially formed over the substrate. The material constituting the first conductive layer includes at least doped polysilicon. Thereafter, the first mask layer, the first conductive layer, the first dielectric layer and the substrate are patterned to form a plurality of trenches in the substrate. After that, insulating material is deposited to fill the trenches and form an array of device isolation structures so that a plurality of parallel-arranged first active regions extending in a first direction and a plurality of parallel-arranged second active regions extending in a second direction are defined. The first direction and the second direction cross over each other. Then, a plurality of doped regions is formed in the first active regions of the substrate. The first mask layer is patterned to form a plurality of openings that exposes at least a portion of the first conductive layer on the first active regions. A thermal oxidation process is performed to form an oxide layer on the exposed first conductive layer. After removing the oxide layer to expose the substrate, the first conductive layer is patterned to partition the first conductive layer into blocks. A plurality of second dielectric layers is formed inside the respective openings. Thereafter, a plurality of second conductive layers serving as control gates is formed over the substrate to fill the openings. Then, a cap layer is formed over the respective second conductive layers. The first mask layer is removed to expose a portion of the first conductive layer. After that, using the cap layers as a mask, a portion of the first conductive layer is removed to form a plurality of floating gates under the respective second conductive layers. Two floating gates are formed in every first active region defined by four device isolation structures. Furthermore, the doped regions are formed between the two floating gates. After forming an insulating layer over the substrate, source/drain regions are formed in the substrate on the respective sides of the second conductive layer. Finally, a plurality of conductive plugs is formed on the substrate to connect with the respective source/drain regions.

In the aforementioned method of forming the flash memory, after the step of forming the device isolation structures, further includes forming a second mask layer over the substrate. The step of forming the doped regions in the substrate is carried out after removing the oxide layer.

In the aforementioned method of forming the flash memory, the second dielectric layer includes an oxide/nitride/oxide composite stacked layer. The first dielectric layer is fabricated from silicon oxide. The material constituting the second conductive layers includes doped polysilicon. The process for removing the oxide layer includes performing an etching operation using hydrogen fluoride as the etching agent. The junction between the oxide layer and the first conductive layer is an arc surface.

In the present invention, the floating gates of the flash memory are formed in a self-aligned process. Therefore, the process window is increased and considerable production cost and time is saved.

Furthermore, the control gates are formed by directly filling an opening in the substrate with a conductive layer and then performing a chemical-mechanical polishing operation or a back etching operation to remove portion of the conductive layer outside the opening until the mask layer is exposed. In the process of forming the control gates, photolithographic techniques are not deployed. Again, the process window is increased and considerable production cost and time is saved.

The present invention also provides a flash memory including a substrate, a tunneling dielectric layer, a pair of floating gates, a control gate, an inter-gate dielectric layer, a doped region and a source/drain region. The tunneling dielectric layer is disposed on the substrate. The two floating gates are disposed on the tunneling dielectric layer. The two floating gates have a right-angled triangular-shaped cross-section with their tilted surfaces facing each other. Furthermore, the substrate is exposed between these two floating gates. The control gate is disposed over the two floating gates. The inter-gate dielectric layer is disposed between the control gate and the two floating gates and serves also to isolate the floating gates. The doped region is disposed in the substrate between the two floating gates. The source/drain regions are disposed in the substrate on the respective sides of the control gate.

In the aforementioned flash memory, the tilted surface of the right-angled triangles are concave. The inter-gate dielectric layer includes an oxide/nitride/oxide composite stacked layer and the tunneling dielectric layer is fabricated from silicon oxide.

In the aforementioned flash memory, another doped region is also formed in the substrate between the two floating gate. The control gate and the floating gates are fabricated using a material including doped polysilicon. Moreover, a well is disposed in the substrate.

In the flash memory of the present invention, a single memory unit has two independent floating gates for storing a bit of data each. Hence, each memory unit in the flash memory can hold two bits of data.

In the aforementioned flash memory, the floating gates are shaped into one having a right-angled triangular cross-section with the tilted side having a concave surface. Therefore, compared with a conventional stacked gate flash memory, the overlapping area between the floating gates and the control gate is increased in the present invention so that the gate-coupling ratio between the floating gates and the control gate is also boosted. As a result, the operating speed of the device is increased and the performance of the device is improved.

Furthermore, the top section of the floating gates has a sharp corner. Hence, a high electric field can be produced to shorten the time needed to erase data from the memory.

The present invention also provides a flash memory including a substrate, a plurality of device isolation structures, a plurality of control gates, a plurality of floating gate, a plurality of doped regions, a plurality of inter-gate dielectric layer, a tunneling dielectric layer and a plurality of source/drain regions. The device isolation structures are disposed in the substrate. The device isolation structures are arranged to form an array so that a plurality of parallel-arranged first active regions extending in a first direction and a plurality of parallel-arranged second active regions extending in a second direction are defined. The first direction and the second direction cross over each other. The control gates are disposed on the first active regions. The control gates extend in the first direction and are parallel to each other. The floating gates are disposed under the control gates and are arranged to form an array. Two floating gates are formed inside each first active region defined by four device isolation structures. The doped regions are disposed underneath the control gates in the substrate between the two floating gates. The inter-gate dielectric layers are disposed between the control gates and the floating gates. The tunneling dielectric layer is disposed between the floating gates and the substrate. The source/drain regions are disposed in the substrate on the respective sides of the control gates.

In the aforementioned flash memory, the two floating gates in the first active region defined by four device isolation structures have a right-angled triangular-shaped cross-section with their tilted surfaces facing each other. Furthermore, the tilted side of the two right-angled triangles has a concave surface. The inter-gate dielectric layers include oxide/nitride/oxide composite stacked layers and the tunneling dielectric layer includes a silicon oxide layer.

In the aforementioned flash memory, the control gates and the floating gates are fabricated using doped polysilicon. Moreover, a well is disposed in the substrate.

In the flash memory of the present invention, each memory unit includes two isolated and independent floating gates each capable of storing one bit of data. As a result, each memory unit in the flash memory can hold two bits of data.

In the aforementioned flash memory, the floating gates have a right-angled triangular-shaped cross-section with the tilted side having a concave surface. Therefore, compared with a conventional stack gate flash memory, the overlapping area between the floating gates and the control gate is increased in the present invention so that the gate-coupling ratio between the floating gates and the control gate is also boosted. As a result, the operating speed of the device is increased and the performance of the device is improved.

Furthermore, the top section of the floating gates has a sharp corner. Hence, a high electric field can be produced to shorten the time needed to erase data from the memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
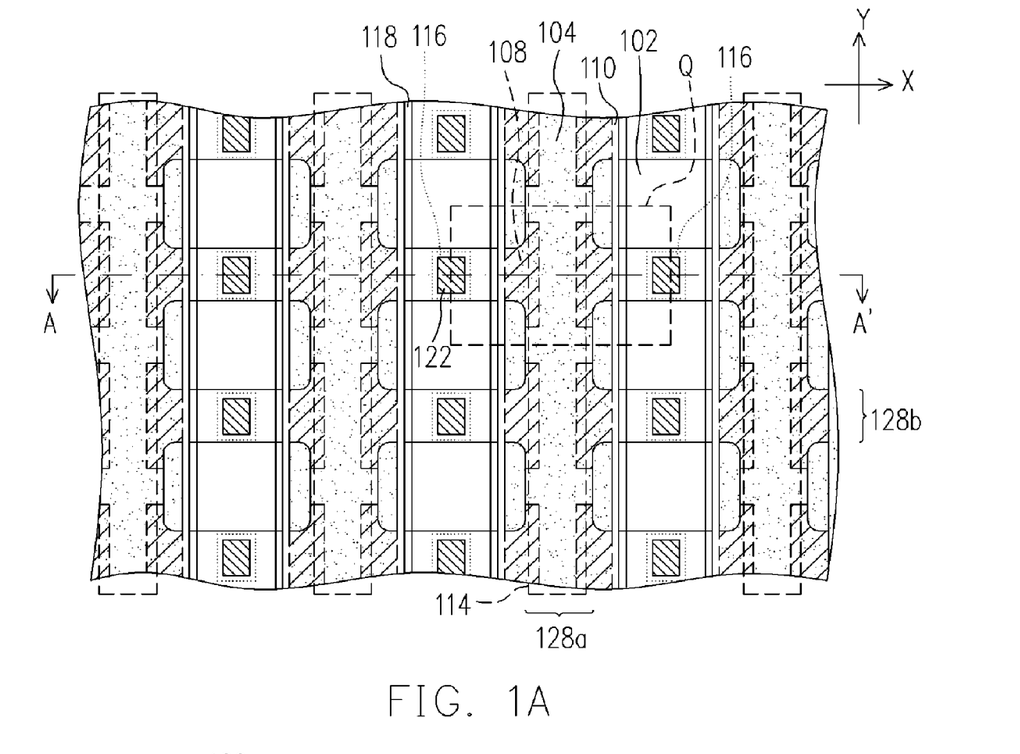
FIG. 1A is a top view of a flash memory according to one preferred embodiment of the present invention.
Figure 1B:
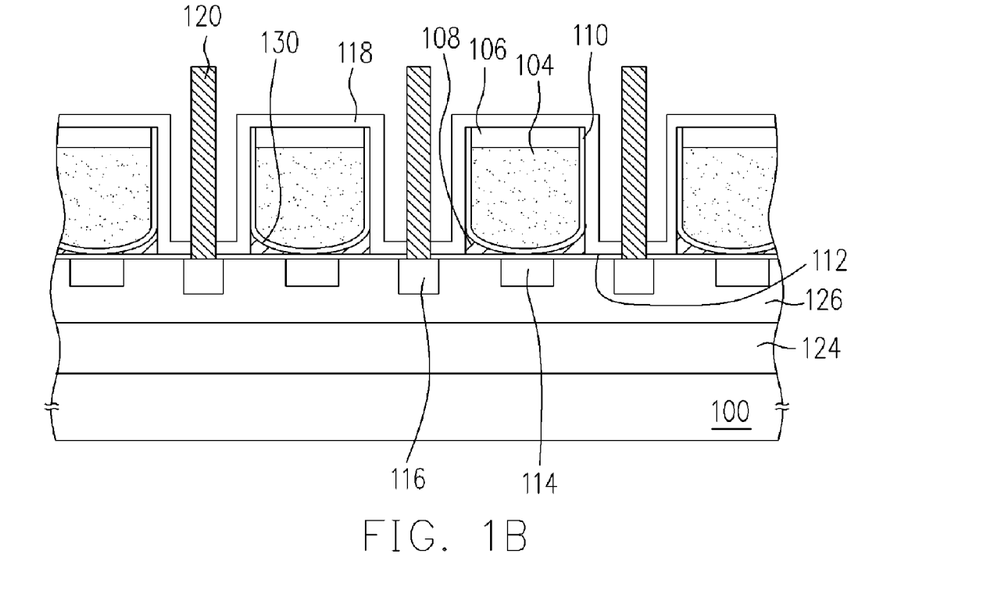
FIG. 1B is a cross-sectional view along line A-A' of FIG. 1A.

FIG. 1A is a top view of a flash memory according to one preferred embodiment of the present invention. FIG. 1B is a cross-sectional view along line A-A' of FIG. 1A. As shown in FIGS. 1A and 1B, the flash memory mainly includes a substrate 100, a plurality of device isolation structures 102, a plurality of control gates 104, a plurality of cap layers 106, a plurality of floating gates 108, a plurality of inter-gate dielectric layers 110, a plurality of tunneling dielectric layers 112, a plurality of doped regions 114, a plurality of source/drain regions 116, an insulating layer 118 and a plurality of conductive plugs 120.

The substrate 100 is a silicon substrate with a deep N-well 124 disposed in the substrate 100, for example. A P-well 126 is also disposed over the deep N-well 124, for example.

A plurality of device isolation structures 102 is disposed in the substrate 100. The device isolation structures are arranged to form an array so that a plurality of parallel-arranged active regions 128a extending in a Y direction and a plurality of parallel-arranged active regions 128b extending in an X direction are defined. Here, the X direction and the Y direction are perpendicular to each other. In other words, the active regions 128a and the active regions 128b defined by the device isolation structure 102 are crossing each other.

The control gates 104 are disposed over the active regions 128a, for example. The control gates 104 extending in the Y direction are arranged in parallel to each other. Part of the control gates 104 cover a portion of the device isolation structures 102 and the active regions 128b. The control gates 104 are fabricated using doped polysilicon, for example.

The floating gates 108 are disposed under the control gates 104 and arranged to form an array. Two floating gates 108 are formed in each active region 128a defined by four device isolation structures 102. The two floating gates 108 have a right-angled triangular-shaped cross-section with their tilted sides facing each other. Furthermore, the tilted sides of the right-angled triangle have a concave surface 130, for example. The floating gates 108 are fabricated using doped polysilicon, for example.

The doped regions 114 are disposed under the control gates 104 in the substrate 100 between the two floating gates 108.

The inter-gate dielectric layers 110 are disposed between the control gates 104 and their corresponding floating gates 104. Furthermore, the inter-gate dielectric layers 110 also isolate the two floating gates 108 in the same unit. The inter-gate dielectric layers can be oxide/nitride/oxide composite stacked layers, for example.

The tunneling dielectric layer 112 is disposed between the floating gates 108 and the substrate 110. The tunneling dielectric layer can be a silicon oxide layer, for example.

The source/drain regions 116 are disposed in the substrate 100 on the respective sides of the control gates 104.

The insulating layer 118 is disposed on the substrate 100 to cover the aforementioned device structure. The insulating layer 118 is fabricated using an insulating material such as silicon oxide or silicon nitride, for example. The conductive plugs 120 are disposed on the substrate for electrically connecting with corresponding source/drain regions 116.

As shown in FIG. 1A, the memory unit Q in the present invention includes a substrate 100, a tunneling dielectric layer 112, two floating gates 108, a control gate 104, an inter-gate dielectric layer 110, a doped region 114 and source/drain regions 116. The memory unit Q has two floating gates 108. The two floating gates 108 are isolated from each other so that each floating gate 108 can store one bit of data. Thus, each memory unit Q in the present invention can hold altogether two bits of data.

In the aforementioned flash memory, the floating gates 108 have a right-angled triangular-shaped cross-section with the tilted side having a concave surface 130. Therefore, compared with a conventional stack gate flash memory, the overlapping area between the floating gates 108 and the control gate 104 is increased in the present invention so that the gate-coupling ratio between the floating gates 108 and the control gate 104 is also boosted. As a result, the operating speed of the device is increased and the performance of the device is improved.

Furthermore, the top section of the floating gates 108 has a sharp corner. Hence, a high electric field can be produced to shorten the time needed to erase data from the memory.

FIGS. 2A through 2H are top views showing the steps for fabricating a flash memory cell according to one preferred embodiment of the present invention. FIGS. 3A through 3H are cross-sectional views along line B-B' of FIGS. 2A through 2H. FIGS. 4A and 4B are cross-sectional views along line C-C' of FIGS. 2A and 2B.

Figure 2A:
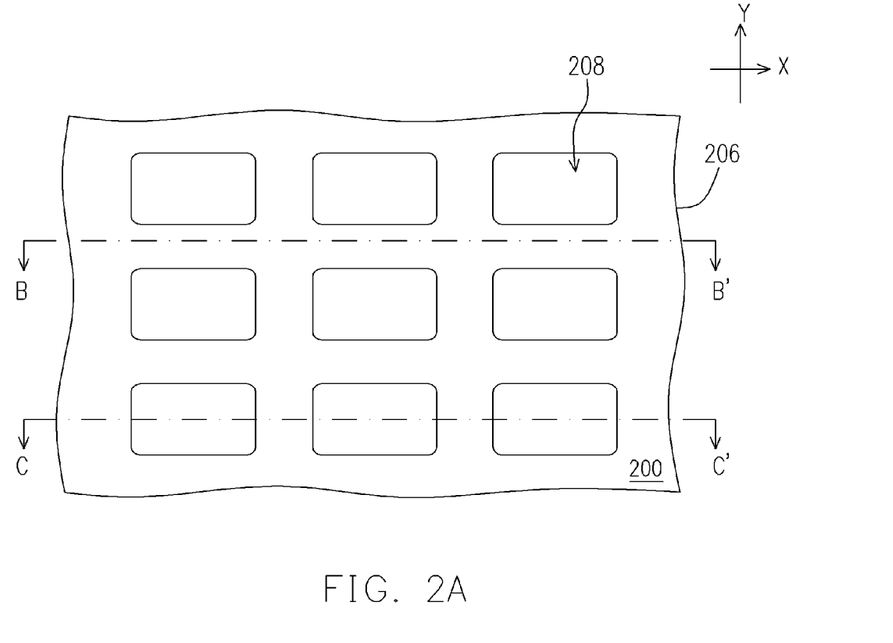
FIGS. 2A through 2H are top views showing the steps for fabricating a flash memory cell according to one preferred embodiment of the present invention.
Figure 3A:
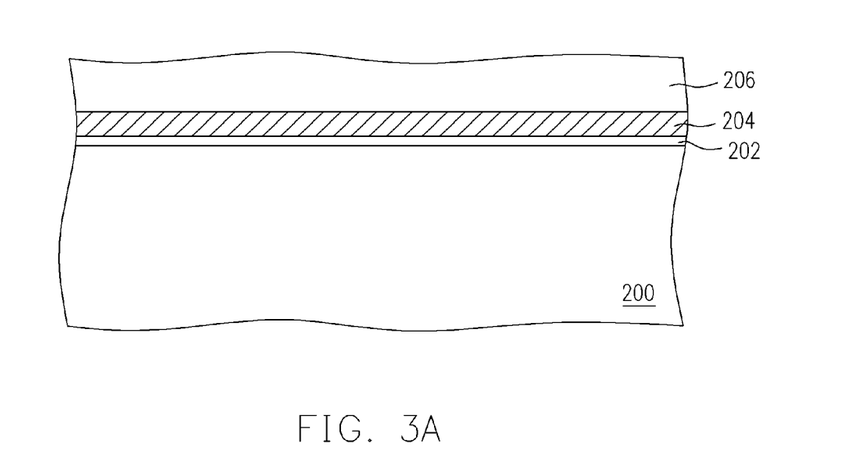
FIGS. 3A through 3H are cross-sectional views along line B-B' of FIGS. 2A through 2H.
Figure 4A:
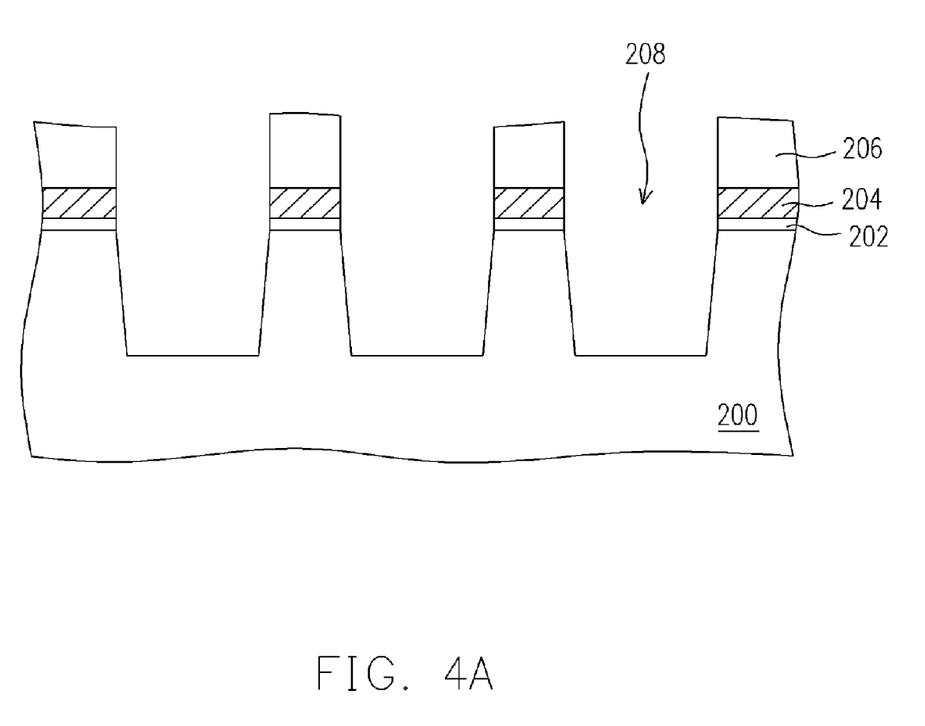
FIGS. 4A and 4B are cross-sectional views along line C-C' of FIGS. 2A and 2B.
Figure 4B:
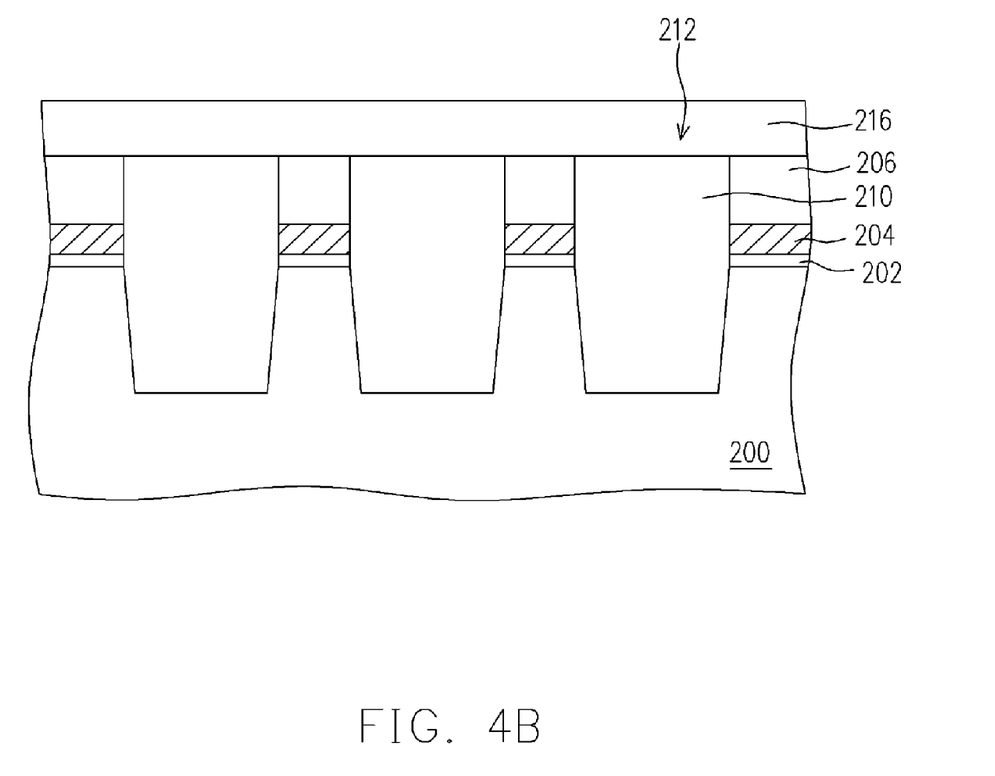

As shown in FIGS. 2A, 3A and 4A, a substrate 200 such as a silicon substrate is provided. The substrate 200 has a deep N-well (not shown) formed therein and a P-well (not shown) formed over the deep N-well. Then, a dielectric layer 202, a conductive layer 204 and a mask layer 206 are sequentially formed over the substrate 200. The dielectric layer 202 is a silicon oxide layer formed, for example, by performing a thermal oxidation process. The conductive layer 204 is a doped polysilicon layer, for example. The method of forming the doped polysilicon layer includes performing a chemical vapor deposition process to form an undoped polysilicon layer and performing an ion implant process thereafter, for example. Alternatively, the doped polysilicon layer is formed, for example, by performing a chemical vapor deposition process with in-situ doping. The mask layer 206 is fabricated using a material having an etching selectivity different from the conductive layer 204 such as silicon nitride. The mask layer 206 is formed, for example, by performing a chemical vapor deposition process.

Thereafter, the mask layer 206, the conductive layer 204 and the dielectric layer 202 are patterned. Using the patterned mask layer 206 as a mask, a portion of the substrate 200 is removed to form a plurality of trenches 208 in the substrate 200. The trenches 208 are arranged to form a column/row matrix.

Figure 2B:
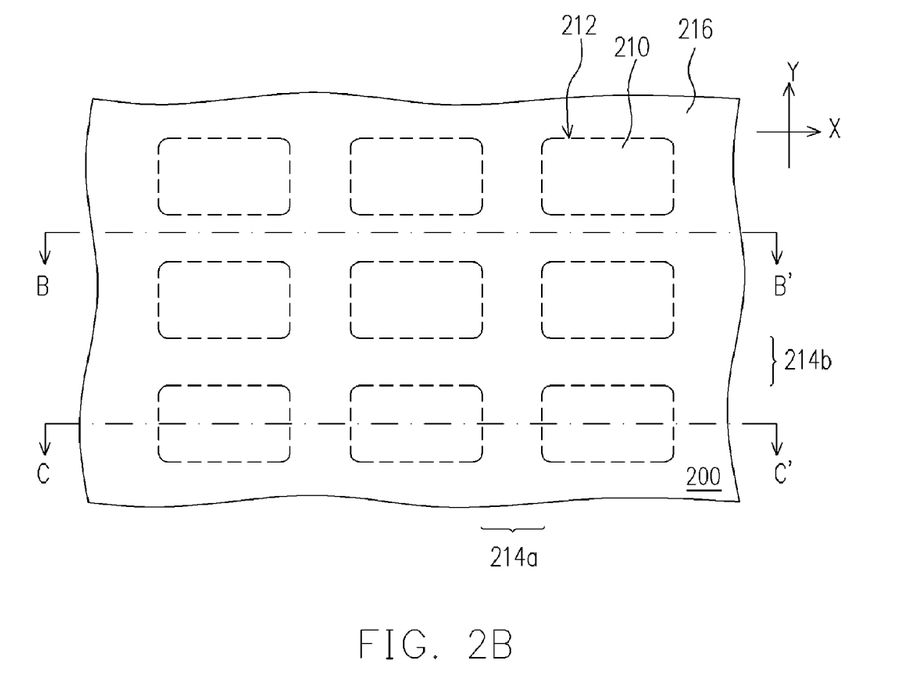
Figure 3B:
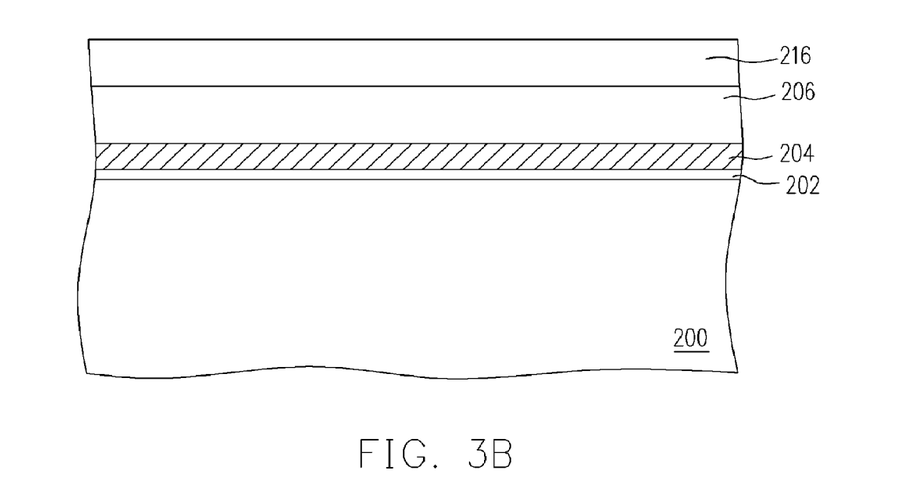

As shown in FIGS. 2B, 3B and 4B, insulating material is deposited into the trenches 208 to form an insulating layer 210 serving as device isolation structures 212. The device isolation structures 212 are arranged to form a column/row matrix so that a plurality of parallel-arranged active regions 214a extending in a Y direction and a plurality of parallel-arranged active regions 214b extending in an X direction are defined. The X direction is perpendicular to the Y direction. In other words, the active regions 214a and the active regions 214b defined by the device isolation structures 212 have a linear layout and cross over each other. The method of forming the insulating layer 210 in the trenches 208 includes, for example, depositing insulating material over the substrate 200 and performing a chemical-mechanical polishing operation or an etching back operation to remove insulating material outside the trenches 208.

After that, another mask layer 216 is formed over the substrate 200. The mask layer 216 is fabricated using a material having an etching selectivity different from a subsequently formed conductive layer such as silicon nitride. The mask layer 216 is formed, for example, by performing a chemical vapor deposition (CVD) process. The mask layer 216 mainly serves to protect the device isolation structures 212. Hence, the mask layer 216 may be formed according to the actual need. Furthermore, there is no particular restriction on the thickness of the mask layer 216. In the following, the subsequent process of fabricating a memory unit is described. Since the cross-sections along line C-C' of FIGS. 2C through 2I do not show the steps for fabricating the memory unit, only the cross-sections along line B-B' from FIGS. 2C to 2I are shown.

Figure 2C:
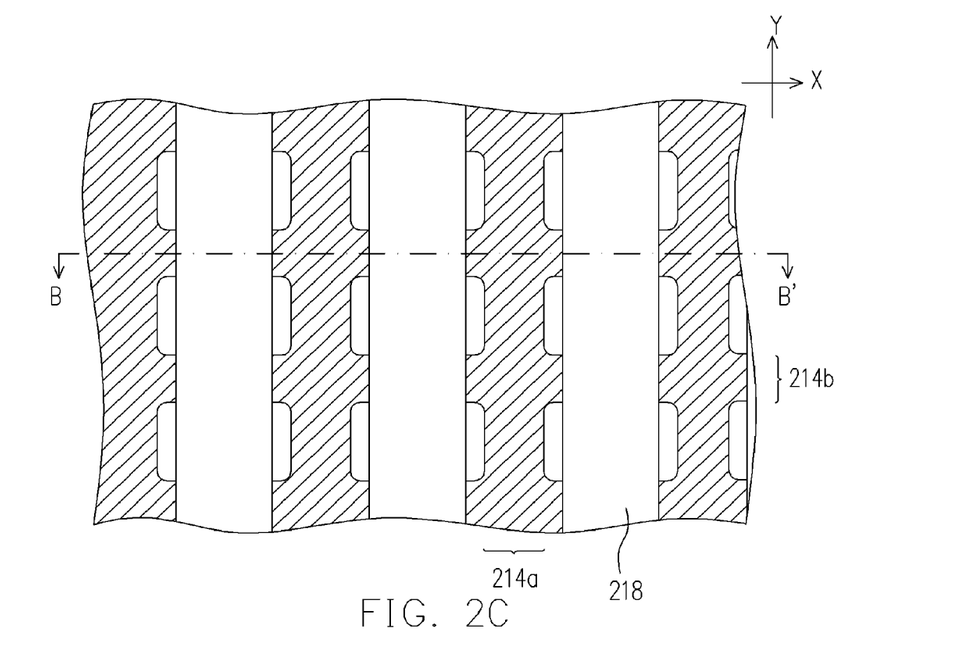
Figure 3C:
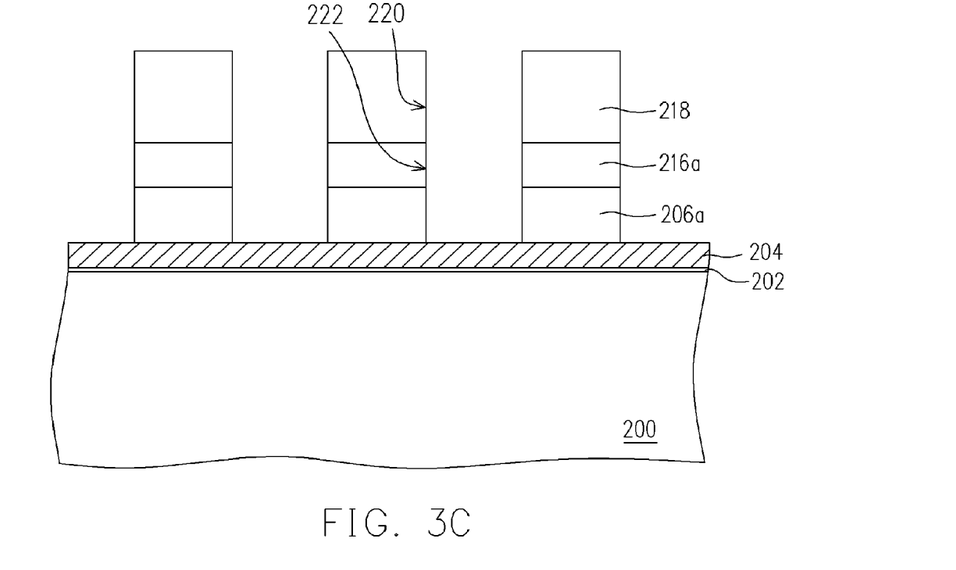

As shown in FIGS. 2C and 3C, a patterned photoresist layer 218 is formed over the substrate 200. The patterned photoresist layer 218 has an opening 220 at least disposed above the active region 214a. Thereafter, using the patterned mask layer 218 as a mask, the mask layer 216 and the mask layer 206 exposed by the opening 220 are removed to form a patterned mask layer 216a and a patterned mask layer 206a. The mask layers 216a and 206a have an opening 222 that exposes a portion of the conductive layer 204. The method of removing the exposed mask layers 216 and 206 includes, for example, performing a dry etching operation or a wet etching operation.

Figure 2D:
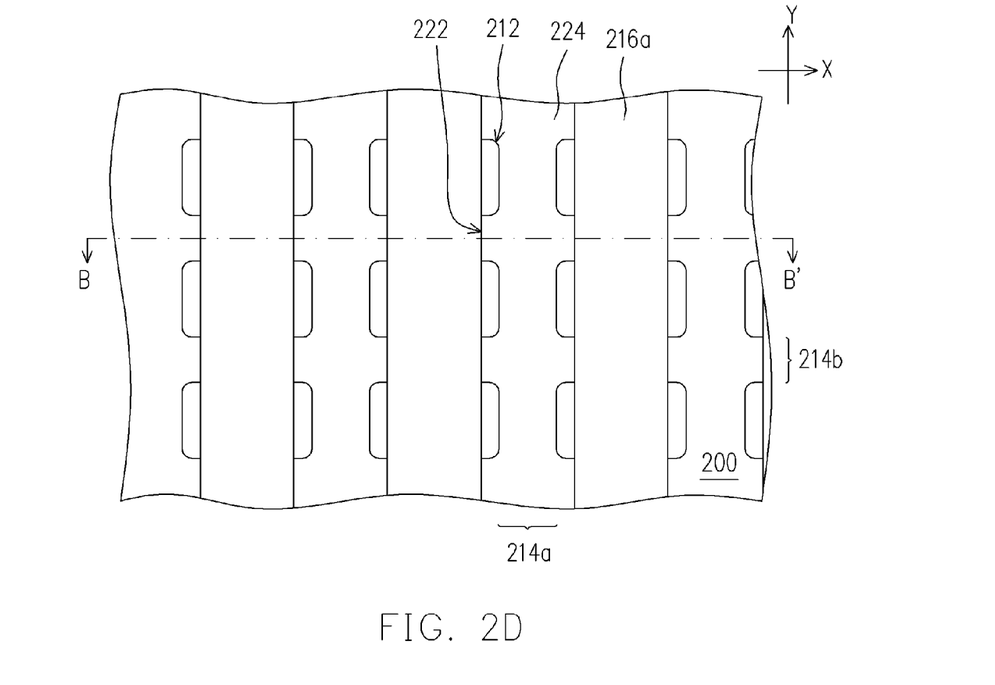
Figure 3D:
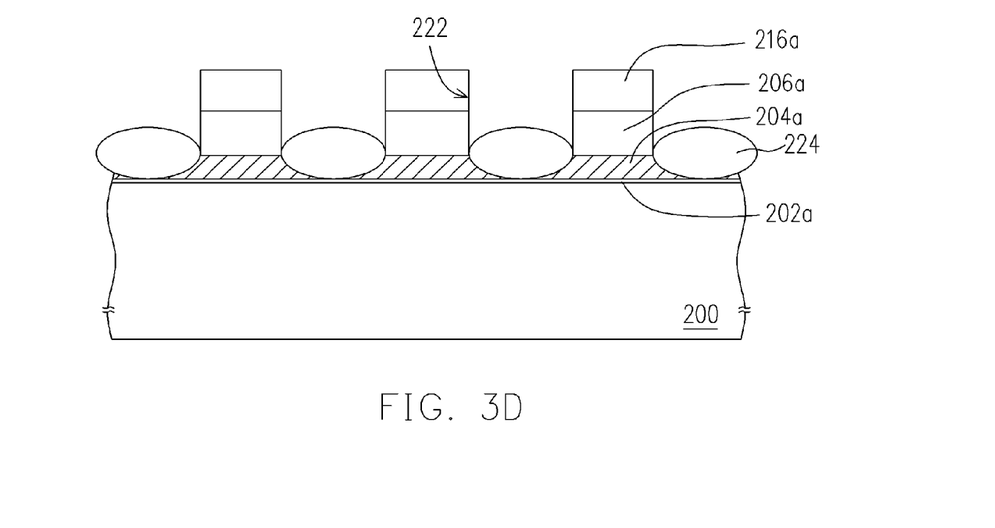

As shown in FIGS. 2D and 3D, the patterned photoresist layer 218 is removed. Then, an oxide layer 224 is formed on the exposed surface of the conductive layer 204. The method of forming the oxide layer 224 over the conductive layer 204 includes performing a thermal oxidation process, for example. In other words, part of the conductive layer 204, which is fabricated using doped polysilicon, will be oxidized into a silicon oxide layer. In general, the oxide layer 224 near the center of the opening 222 is thicker than the oxide layer 224 close to the respective sides of the opening 222. Furthermore, the oxide layer 224 in the central portion of the opening 222 can partition the conductive layer 204 into linear strips.

Figure 2E:
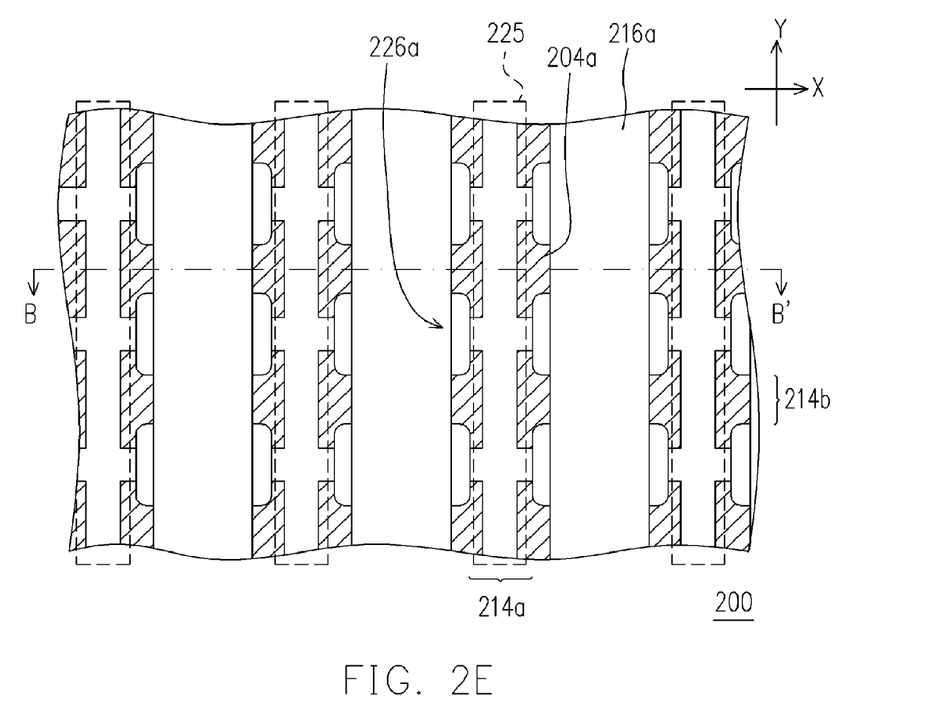
Figure 3E:
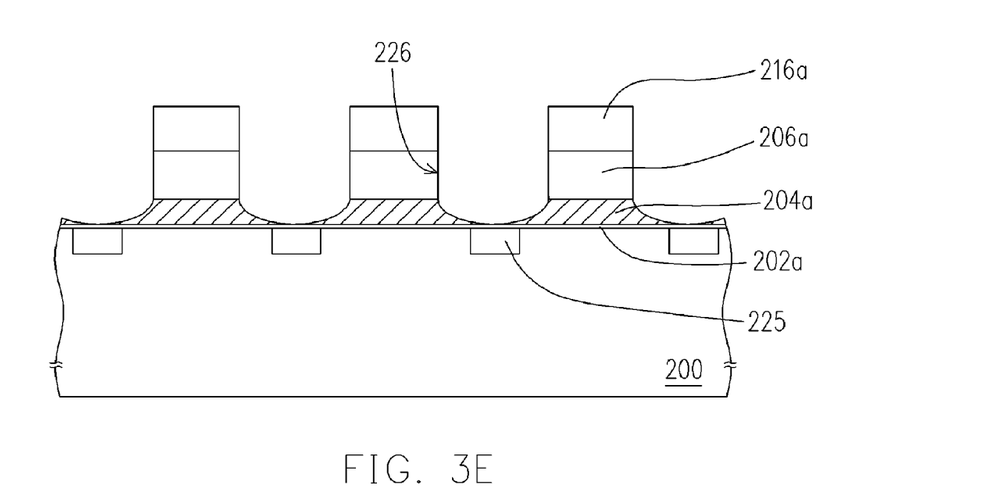

As shown in FIGS. 2E and 3E, the oxide layer 224 exposed by the opening 222 is removed to form an opening 226. The method of removing the exposed oxide layer 224 includes performing a wet etching operation using hydrofluoric acid as the etching agent, for example. After removing the oxide layer 224, the conductive layer 204 is again patterned to form block-shaped conductive layers 204a. The method of patterning the conductive layer 204 includes performing a photolithographic and etching process. Furthermore, the conductive layer 204a exposed by the opening 226 has a concave surface, for example. In the process of removing the oxide layer 224, a portion of the dielectric layer 202 will also be removed to form a dielectric layer 202a underneath the conductive layer 204a. Thereafter, a doped region 225 is formed between the conductive layers 204a. The doped regions 225 are formed, for example, by performing an ion implant process. Obviously, the doped regions 225 can be fabricated together with the well in the substrate 200.

Figure 2F:
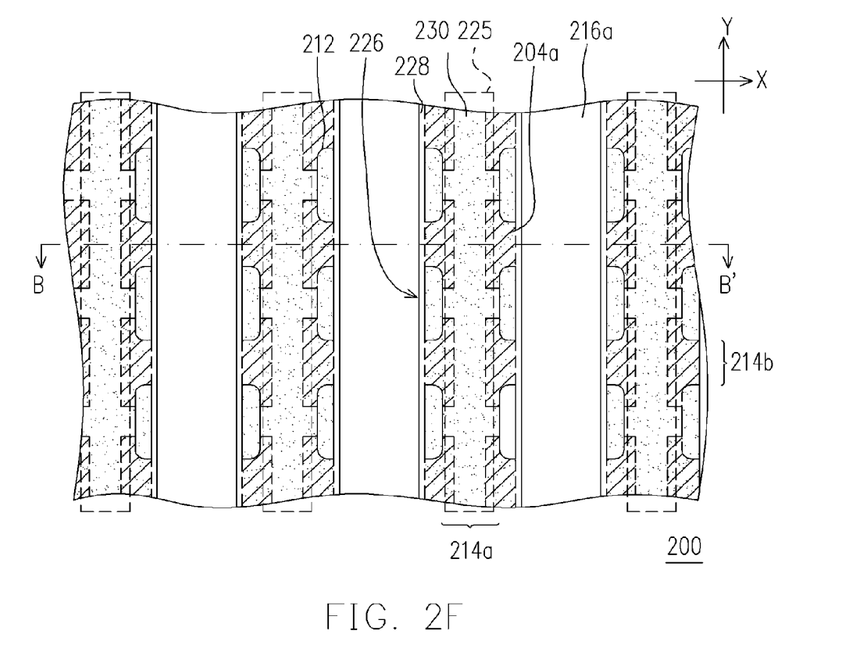
Figure 3F:
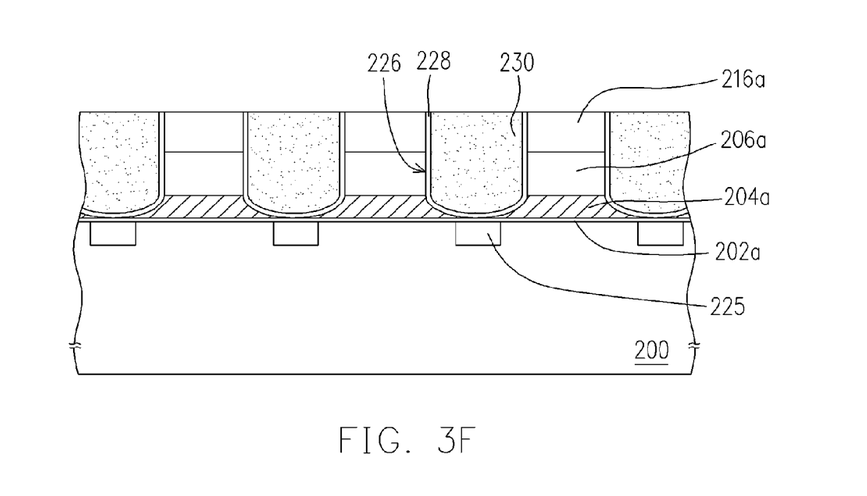

As shown in FIGS. 2F and 3F, inter-gate dielectric layers 228 are formed over the substrate 200. The inter-gate dielectric layers can be oxide/nitride/oxide composite state layers, for example. Obviously, the inter-gate dielectric layers 228 can be silicon oxide layers or oxide/nitride composite stacked layers as well. The method for forming the inter-gate dielectric layers 228 includes performing a thermal oxidation process to form a silicon oxide layer.

Thereafter, a chemical vapor deposition process is performed to fabricate a silicon nitride layer on the oxide layer. Finally, a portion of the silicon nitride layer is oxidized using wet hydrogen/oxygen ($H_2/O_2$) gases. After that, conductive layers 230 are formed to fill the openings 226 in the substrate 200. The conductive layers 230 serve as control gates. The conductive layers 230 are doped polysilicon layers formed, for example, by depositing doped polysilicon over the substrate 200 and performing an etching back operation or a chemical-mechanical polishing operation to remove a portion of the doped polysilicon layer until the surface of the mask layer 216a is exposed. The method of forming the doped polysilicon layer includes performing a chemical vapor deposition process to form an undoped polysilicon layer and performing an ion implant process thereafter, for example. Alternatively, the doped polysilicon layer is formed, for example, by performing a chemical vapor deposition process with in-situ doping.

Figure 2G:
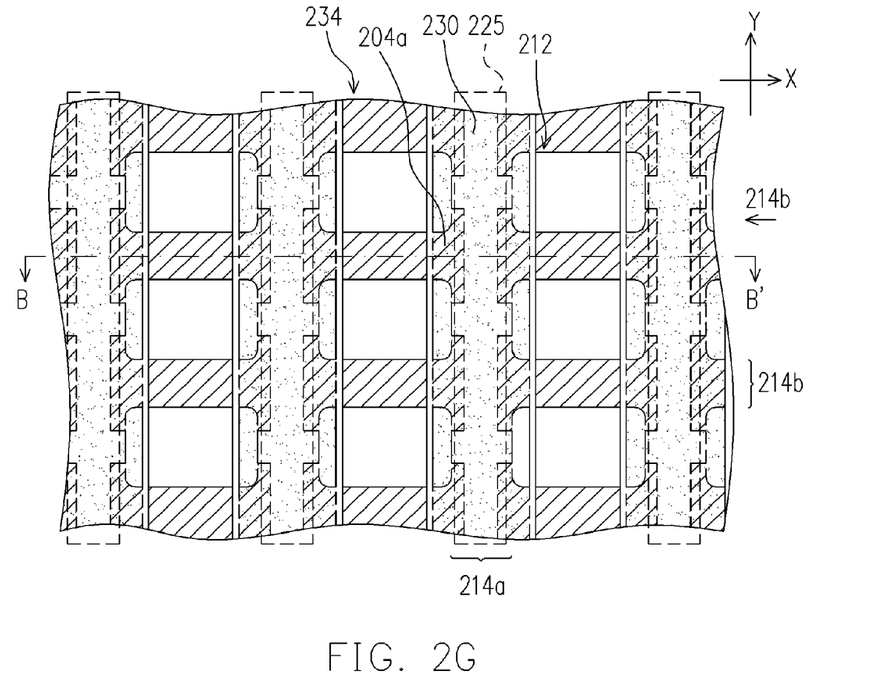
Figure 3G:
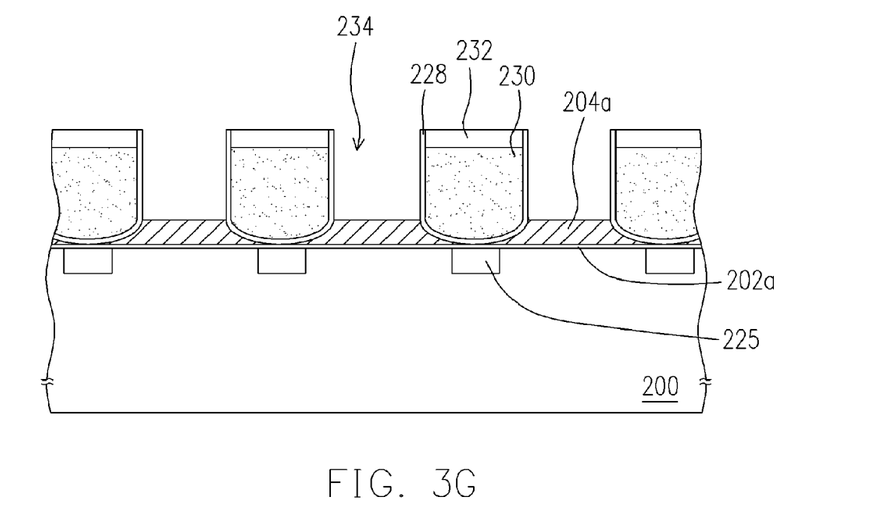

As shown in FIGS. 2G and 3G, a cap layer 232 is formed on the surface of each conductive layer 230. The cap layers 232 are fabricated from silicon oxide material, for example. The cap layers 232 are formed, for example, by performing a thermal oxidation process. Thereafter, the mask layers 216a and the mask layers 206a are removed to form openings 234 that exposes a portion of the conductive layers 204a. The method of removing the mask layers 216a and 206a includes performing a dry etching operation or a wet etching operation.

Figure 2H:
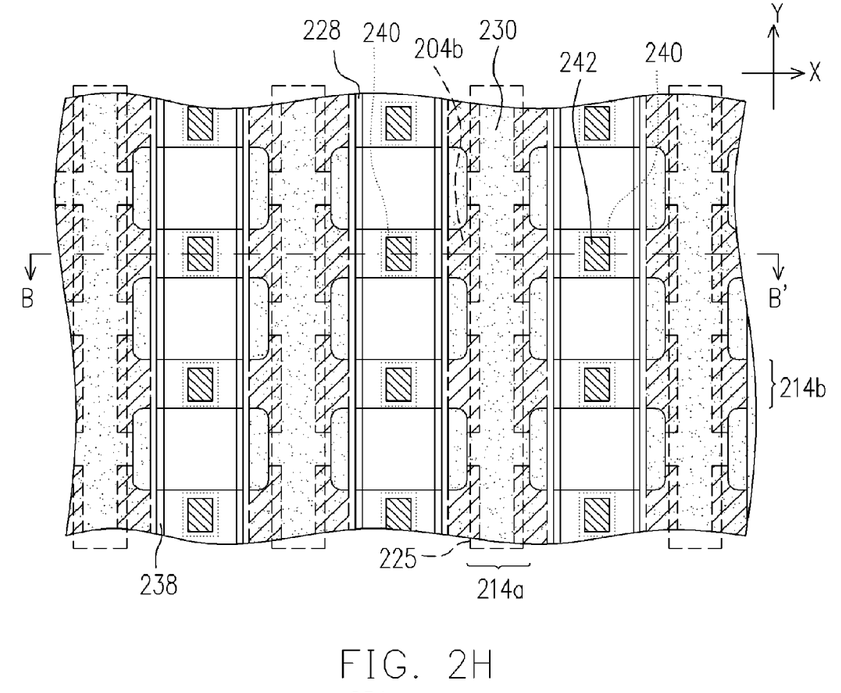
Figure 3H:
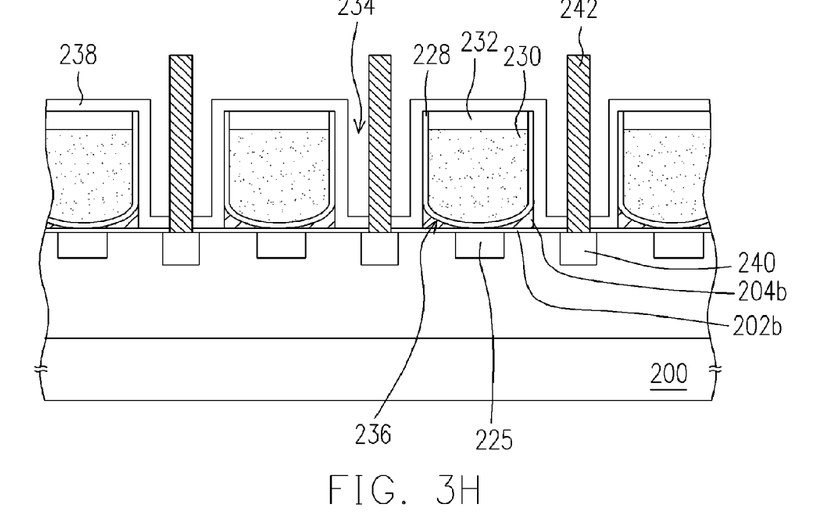

As shown in FIGS. 2H and 3H, using the conductive layers 230 with a cap layer 232 thereon as a mask, a portion of the conductive layers 204a is removed to form openings 234 and dissect the conductive layers 204a to produce conductive layers 204b. The conductive layers 204b serve as floating gates. As shown in FIG. 2H, the two conductive layers 204b (the floating gates) underneath the conductive layer 230 (the control gate) defined by four device isolation structures 212 have a right-angled triangular-shaped cross-section with the tilted surface facing each other. Furthermore, the tilted side of the right-angled triangles has a concave surface. In the process of removing a portion of the conductive layer 204a, a portion of the dielectric layer 202a is also removed to form a dielectric layer 202b. The dielectric layers 202b serve as the tunneling dielectric layers.

Thereafter, at least one insulating layer 238 is formed over the substrate 200. After that, a source/drain region 240 is formed in the substrate on the respective sides of the conductive layers 230 (the control gate). The source/drain regions 240 are formed, for example, by performing an ion implant process. Then, conductive plugs 242 are formed on the substrate 200 to connect with corresponding source/drain regions 240. Obviously, the insulating layer 238 may form over the substrate 200 after forming the source/drain regions 240 for protecting the conductive layers 230 (the control gates and the conductive layers 204b (the floating gates) prior to forming the conductive plugs. Since the subsequent steps for completing the fabrication of the flash memory involve conventional processes, a detailed description is omitted.

According to the embodiment in the present invention, the conductive layers 204b (the floating gates) are fabricated by performing a thermal oxidation process and an etching process to dissect the conductive layer 204 into conductive layer blocks 204a. Then, the conductive layer blocks 204a are etched using the conductive layers 230 (the control gates) with a cap layer 232 thereon as a mask. Because the conductive layer 204b (the floating gates) are formed in a self-aligned process, the process window is increased so that considerable production cost and time is saved.

Furthermore, the conductive layers 230 (the control gates) in the present invention are formed by directly filling the opening 226 in the substrate 200 with a conductive layer and then performing a chemical-mechanical polishing operation or a back etching operation to remove portion of the conductive layer outside the opening 226 until the mask layer 216a is exposed. In the process of forming the conductive layers 230 (the control gates), photolithographic techniques are not deployed. Thus, the process window is increased and considerable production cost and time is saved.

In addition, the conductive layers 204b (the floating gates) have a right-angled triangular-shaped cross-section with a tilted side having a concave surface 236. Therefore, compared with a conventional stack gate flash memory, the overlapping area between the conductive layer 204b (the floating gate) and the conductive layer 230 (the control gate) in the present invention is significantly increased so that the gate-coupling ratio between the conductive layer 204b (the floating gate) and the conductive layer 230 (the control gate) is also boosted. As a result, the operating speed of the device is increased and the performance of the device is improved.

Furthermore, the top section of the conductive layers 204b (the floating gates) has a sharp corner. Hence, a high electric field can be produced at the corner regions of the conductive layers 204b (the floating gates) to shorten the time needed to erase data from the memory. Moreover, the voltage applied to the conductive layers 230 (the control gates) can be reduced.

In the flash memory of the present invention, each memory unit includes two isolated and independent floating gates each capable of storing one bit of data. As a result, each memory unit in the flash memory can hold two bits of data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory, comprising:
   a substrate;
   a tunneling dielectric layer disposed on the substrate;
   two floating gates disposed on the tunneling dielectric layer, wherein the two floating gates have a right-angled triangular-shaped cross-section with a concave surface, and each of the two floating gates is used to store a bit of data;
   a control gate disposed over the two floating gates, wherein an overlapping area between the two floating gates and the control gate is increased by the concave surface;
   an inter-gate dielectric layer disposed between the control gate and the two floating gates; and
   source/drain regions disposed in the substrate on the respective sides of the control gate.

2. The flash memory of claim 1, wherein the inter-gate dielectric layer comprises an oxide/nitride/oxide composite stacked layer.

3. The flash memory of claim 1, wherein the material constituting the tunneling dielectric layer comprises silicon oxide.

4. The flash memory of claim 1, further comprises a doped region disposed in the substrate between the two floating gates.

5. The flash memory of claim 1, wherein the material constituting the control gate and the two floating gates comprises doped polysilicon.

6. The flash memory of claim 1, further comprises a well region disposed in the substrate.

7. A flash memory, comprising:
a substrate;
a plurality of device isolation structures disposed in the substrate, wherein the device isolation structures are arranged to form an array for defining a plurality of parallel-arranged first active regions extending in a first direction and a plurality of parallel-arranged second active regions extending in a second direction such that the first direction and the second direction cross over each other;
a plurality of control gates disposed on the first active regions, wherein the control gates are parallel to each other and extends in the first direction;
a plurality of floating gates disposed underneath the control gates and arranged to form an array such that two floating gates are formed in each first active region defined by four device isolation structures, wherein the two floating gates have a right-angled triangular-shaped cross-section with a concave surface for increasing an overlapping area between the two floating gates and the control gate;
a plurality of doped regions disposed under the control gates and in the substrate between the two floating gates;
a plurality of inter-gate dielectric layers disposed between the respective control gates and corresponding the two floating gates;
a tunneling dielectric layer disposed between the floating gates and the substrate; and
a plurality of source/drain regions disposed in the substrate on the respective sides of the control gates.

8. The flash memory of claim 7, wherein the inter-gate dielectric layers comprise oxide/nitride/oxide composite stacked layers.

9. The flash memory of claim 7, wherein the material constituting the tunneling dielectric layer comprises silicon oxide.

10. The flash memory of claim 7, wherein the material constituting the control gates and the two floating gates comprises doped polysilicon.

11. The flash memory of claim 7, further comprising a well region disposed in the substrate.

12. The flash memory of claim 7, further comprising a plurality of conductive plugs disposed on the substrate and the conductive plugs being electrically connected to corresponding source/drain regions.

* * * * *